United States Patent
Chang et al.

(10) Patent No.: US 9,998,112 B1
(45) Date of Patent: Jun. 12, 2018

(54) MICROCONTROLLER AND RESET CIRCUIT THEREOF

(71) Applicant: Nuvoton Technology Corporation, Hsinchu Science Park (TW)

(72) Inventors: Pao-Shu Chang, Hsinchu (TW); Wen-Hao Tsai, Hsinchu (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 0 days. days.

(21) Appl. No.: 15/589,495

(22) Filed: May 8, 2017

(30) Foreign Application Priority Data

Jan. 18, 2017 (TW) .............................. 106101639 A

(51) Int. Cl.
| H03L 7/00 | (2006.01) |
| H03K 17/22 | (2006.01) |
| H03K 19/20 | (2006.01) |
| H03K 3/037 | (2006.01) |

(52) U.S. Cl.
CPC ............. *H03K 17/22* (2013.01); *H03K 3/037* (2013.01); *H03K 19/20* (2013.01)

(58) Field of Classification Search
CPC ......... H03K 17/22; H03K 3/037; H03K 19/20
USPC ................................................. 327/141–143
See application file for complete search history.

(56) References Cited

U.S. PATENT DOCUMENTS

| 6,076,161 A * | 6/2000 | Ho | G06F 9/321 |
| | | | 712/E9.035 |
| 6,181,173 B1 * | 1/2001 | Homol | H03K 17/223 |
| | | | 327/143 |
| 6,868,500 B1 * | 3/2005 | Kutz | G06F 1/24 |
| | | | 323/266 |
| 6,879,193 B2 * | 4/2005 | Okamoto | G06F 1/24 |
| | | | 327/143 |
| 7,400,179 B2 * | 7/2008 | Lin | G06F 1/24 |
| | | | 327/143 |
| 7,965,113 B2 * | 6/2011 | Fuller | G06F 1/24 |
| | | | 327/142 |

(Continued)

FOREIGN PATENT DOCUMENTS

| CN | 104216737 A | 12/2014 |
| TW | 200641589 A | 12/2006 |

(Continued)

*Primary Examiner* — Ryan Jager
(74) *Attorney, Agent, or Firm* — Muncy, Geissler, Olds & Lowe, P.C.

(57) ABSTRACT

A microcontroller is provided and includes a reset pin, a reset circuit, and a first logical circuit. A first reset signal is generated at the reset pin when the microcontroller is powered on. The reset circuit receives the first reset signal and generates a second reset signal. The reset circuit includes a plurality of flipflops. After the microcontroller is powered on, the reset circuit switches a state of the second reset signal according to the first reset signal when an output combination of a plurality of output values of the plurality of flipflops is not a specific value. The first logical circuit performs a first initialization operation when the state of the second reset signal is switched. When the second reset signal is switched, the reset circuit sets the output combination of the plurality of output values of the plurality of flipflops to the specific value.

10 Claims, 3 Drawing Sheets

(56) References Cited

U.S. PATENT DOCUMENTS

| | | | | |
|---|---|---|---|---|
| 8,917,266 | B2* | 12/2014 | Park | G09G 3/2096 |
| | | | | 326/93 |
| 2002/0166044 | A1* | 11/2002 | Muth | G06F 1/24 |
| | | | | 713/1 |
| 2006/0012409 | A1* | 1/2006 | Wadhwa | H03K 17/223 |
| | | | | 327/143 |
| 2009/0174444 | A1* | 7/2009 | Dribinsky | H03K 17/22 |
| | | | | 327/143 |
| 2010/0308877 | A1* | 12/2010 | Chou | H03K 17/20 |
| | | | | 327/143 |
| 2012/0250432 | A1* | 10/2012 | Fukushima | G11C 7/20 |
| | | | | 365/191 |

FOREIGN PATENT DOCUMENTS

| TW | 200700967 A | 1/2007 |
|---|---|---|
| TW | 200741446 A | 11/2007 |
| TW | 201608365 A | 3/2016 |

* cited by examiner

MICROCONTROLLER AND RESET CIRCUIT THEREOF

CROSS REFERENCE TO RELATED APPLICATIONS

This Application claims priority of Taiwan Patent Application No. 106101639, filed on Jan. 18, 2017, the entirety of which is incorporated by reference herein.

BACKGROUND OF THE INVENTION

Field of the Invention

The invention relates to a microcontroller, and more particularly to a reset circuit of a microcontroller.

Description of the Related Art

In a microcontroller, some registers perform initialization operations to set initial values after the microcontroller is powered on and also perform initialization operations to set initial values after the system is reset, and some registers perform initialization operations only after the microcontroller is powered on. For the later registers, after the microcontroller is reset, the values stored in these registers are not resumed to the initial values. Thus, a power-on reset circuit, which enables specific registers to perform initialization operations after the microcontroller is powered on, is provided. However, in some cases, for example, in the cases where the power-on reset circuit does not work since the microcontroller is powered on with an excessively low speed, the corresponding registers are not initialized, which results in system error operations.

BRIEF SUMMARY OF THE INVENTION

An exemplary embodiment of a microcontroller is provided. The microcontroller comprises a reset pin, a reset circuit, and a first logical circuit. A first reset signal is generated at the reset pin when the microcontroller is powered on. The reset circuit receives the first reset signal and generates a second reset signal. The reset circuit comprises a plurality of flipflops. After the microcontroller is powered on, the reset circuit switches a state of the second reset signal according to the first reset signal when an output combination of a plurality of output values of the plurality of flipflops is not a specific value. The first logical circuit receives the second reset signal. The first logical circuit performs a first initialization operation when the state of the second reset signal is switched. When the second reset signal is switched, the reset circuit sets the output combination of the plurality of output values of the plurality of flipflops to the specific value.

Another exemplary embodiment of a microcontroller is provided. The microcontroller comprises a reset pin, a reset circuit, and a first logical circuit. When a supply voltage is provided to the microcontroller, a level of a first reset signal at the reset pin gradually rises from an initial level. The reset circuit is coupled to the reset pin and generates a second reset signal. During a period when the level of the first reset signal gradually rises, the reset circuit switches a level of the second reset signal from a first level to a second level at a first time point. The first logical circuit receives the second reset signal. The first logical circuit performs a first initialization operation when the level of the second reset signal is switched from the first level to the second level. During a period when the supply voltage is provided to the microcontroller continuously, after the time point, when the level of the first reset signal is switched to the initial level and then gradually rises again, the reset circuit maintains the level of the second reset signal at the second level.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
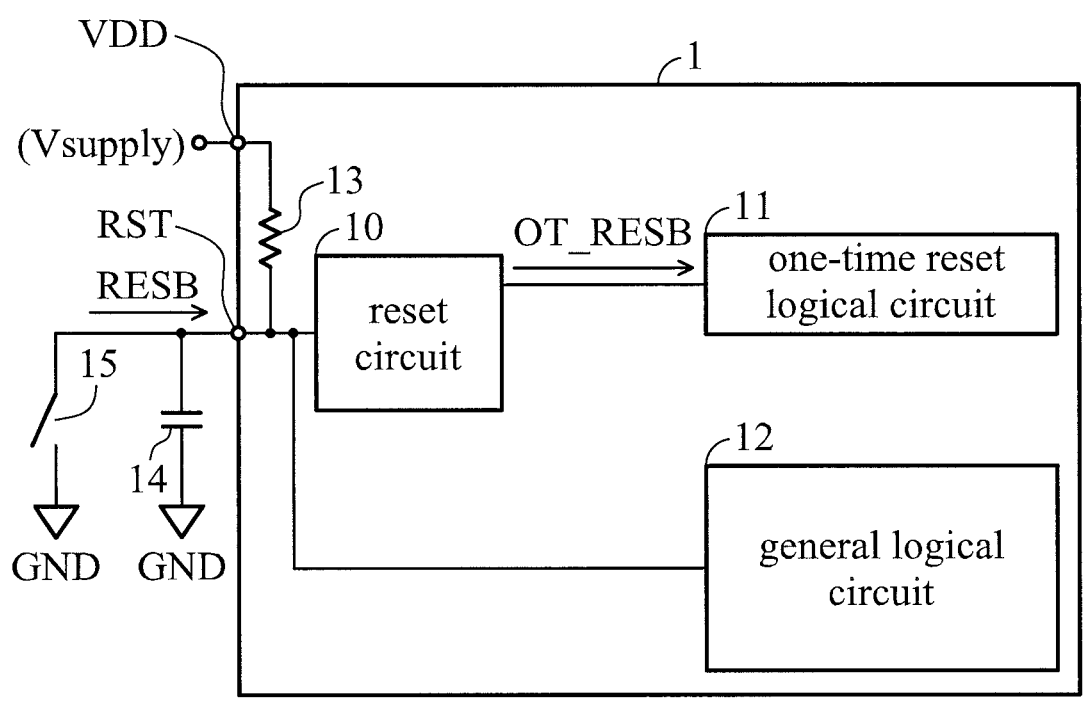
FIG. 1 shows an exemplary embodiment of a microcontroller of the invention.

FIG. 1 shows an exemplary embodiment of a microcontroller of the invention. Referring to FIG. 1, the microcontroller 1 comprises a reset circuit 10, a one-time reset logical circuit 11, and a general logical circuit 12. In the embodiment, the one-time logical circuit 11 is the circuit which performs an initialization operation only after the microcontroller 1 is powered on, and the general logical circuit is the circuit which performs an initialization operation after the microcontroller 1 is powered on and also performs an initialization operation after the microcontroller 1 is reset. In an embodiment, the one-time logical operation 11 comprises a register or a plurality of registers, such as a register for power control. The general logical register 12 comprises a register or a plurality of registers. The power-on and reset of the microcontroller 1 will be described in the later paragraphs. Referring to FIG. 1, the microcontroller 1 further comprises a resistor 13, a reset pin RST, and a power pin VDD. One terminal of the resistor 13 is coupled to the power pin VDD, and the other terminal thereof is coupled to the reset pin RST. FIG. 1 also shows a capacitor 14 and a switch 15. The capacitor 14 is disposed on the outside of the microcontroller 1 and coupled between the reset pin RST and a ground terminal GND. Similarly, the switch 15 is disposed on the outside of the microcontroller 1 and coupled between the reset pin RST and a ground terminal GND. Accordingly, the level of the reset signal RESB on the reset pint RST is determined according to the voltage of the power pin VDD and the on/off state of the switch 15. The reset signal RESB is provided to the reset circuit 10 and the general logical circuit 12.

Figure 2:
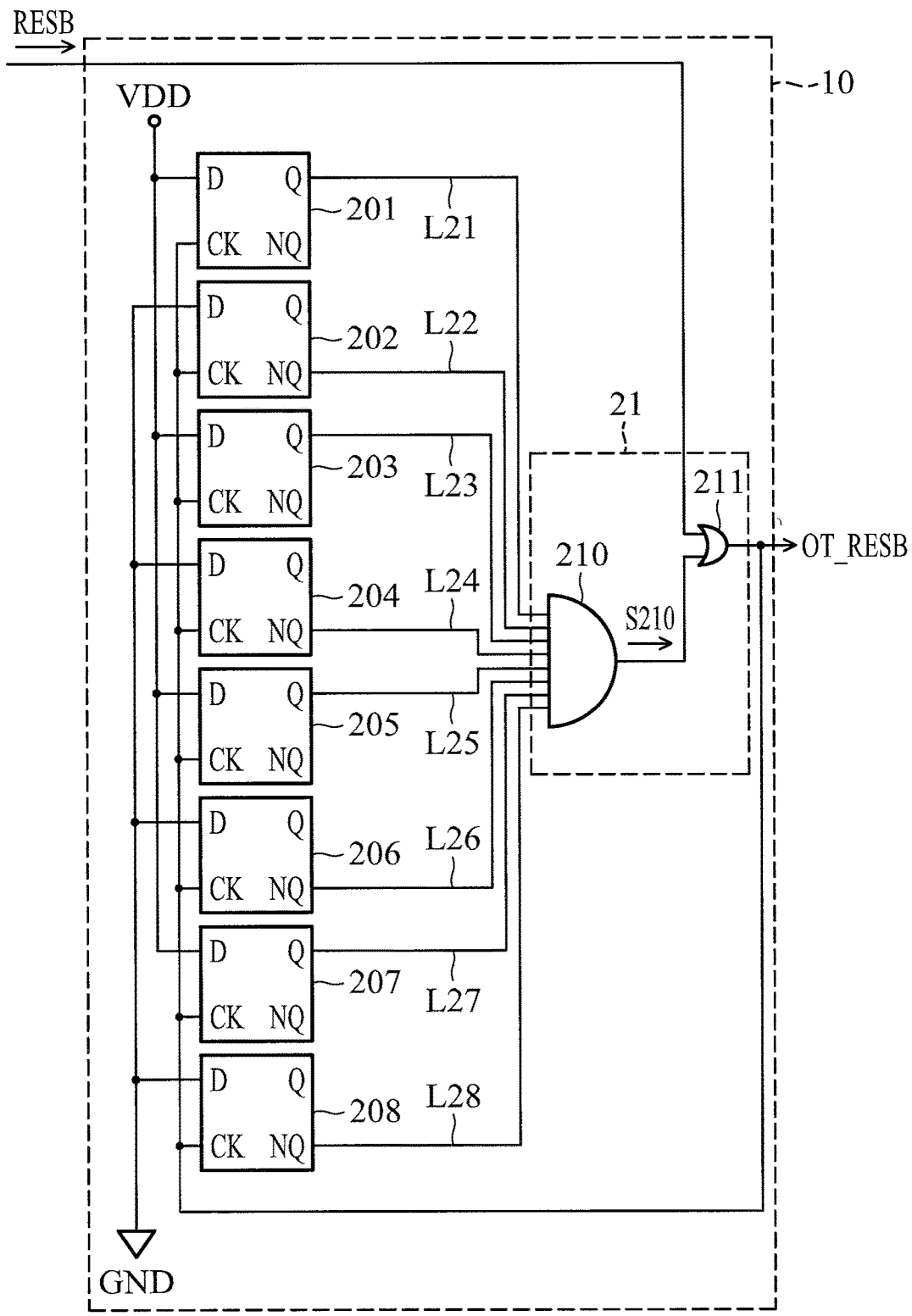
FIG. 2 shows an exemplary embodiment of a reset circuit of the invention.

FIG. 2 shows an exemplary embodiment of the reset circuit of the invention. Referring to FIG. 2, the reset circuit 10 comprises a plurality of flipflops and a determination logic circuit 21. In the embodiment of FIG. 2, eight flipflops 201-208 are given as an example. The flipflops 201-208 are positive-edge triggered flipflops. Each flipflop has an input terminal D, a clock terminal CK, a positive output terminal Q, and a negative output terminal NQ. The input terminals D of the flipflops 201, 203, 205, and 207 are coupled to the power pin VDD, while the input terminals D of the flipflops 202, 204, 206, and 208 are coupled to the ground terminal GND. The output values at the positive output terminals Q of the flipflops 210-208 form an output combination. The determination logic circuit 21 is coupled to the positive output terminals Q of the flipflops 201, 203, 205, and 207 and the negative output terminals NQ of the flipflops 202, 204, 206, and 208. For each flipflop, the value at the positive output terminal Q is inverse to the value at the negative output terminal NQ. Thus, the determination logic circuit 21 determines whether the output combination formed by the output values at the positive output terminals Q of the flipflops 210-208 is a predetermined specific value through receiving the output values at the positive output terminals Q of the flipflops 201, 203, 205, and 207 and the output values at the negative output terminals NQ of the flipflops 202, 204, 206, and 208. In the embodiment, the specific value is preset as "10101010". In the embodiment of FIG. 2, the determination logic circuit 21 comprises an AND gate 210 and an OR gate 211. The input terminals of the AND gate 210 are coupled to the positive output terminals Q of the flipflops 201, 203, 205, and 207 and the negative output terminals NQ of the flipflops 202, 204, 206, and 208 in order to receive the output values. The output terminal of the AND gate 210 generates a determination signal S210 to indicate whether the output combination formed by the output values of the flipflops 210-208 is the specific value. The two input terminals of the OR gate 211 receive the reset signal RESB and the determination signal S210 respectively, and the output terminal thereof generates another reset signal OT_RESB. The reset signal OT_RESB is provided to the one-time logical circuit 11. The reset signal OT$_{13}$ RESB is also provided to the clock terminals CK of the flipflops 201-208 to serve as a trigger signal for the flipflops 201-208.

In an embodiment, the microcontroller 1 is disposed on a chip substrate, and the locations where the flipflops 201-208 are disposed are close to each other. Moreover, the lines L21-L28 respectively coupled between the flipflops 201-208 and the AND gate 210 are arranged symmetrically, as shown in FIG. 2.

Figure 3:
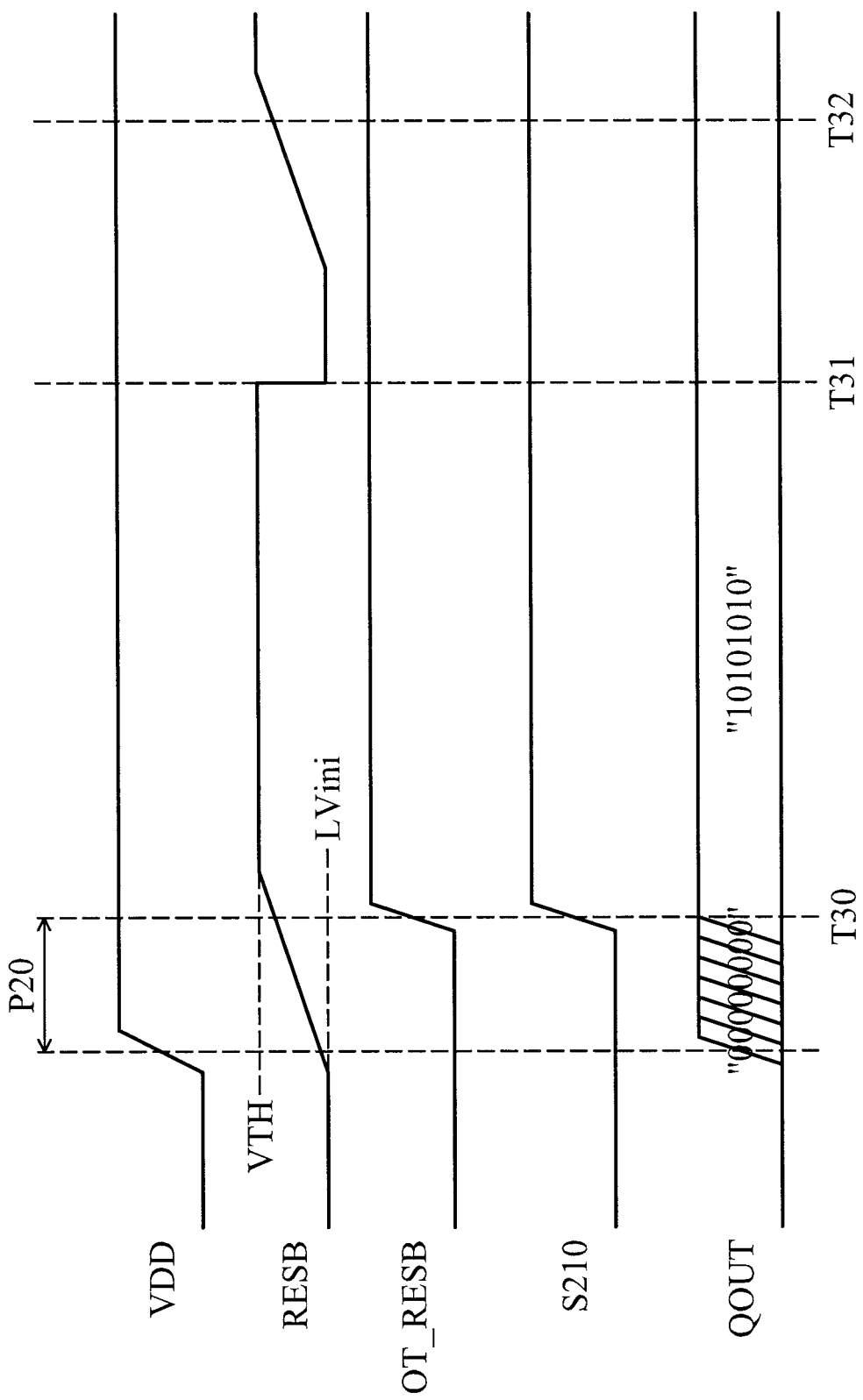
FIG. 3 shows the variation of the voltage level of the power pin, the reset signals, and the output combination of the flipflops shown in FIG. 1 according to an exemplary embodiment.

FIG. 3 shows the variation of the voltage level of the power pin VDD, the reset signals RESB and OT_RESB, and the output combination QOUT of the flipflops 201-208 according to an exemplary embodiment. In the following, the operation of the reset circuit 10 will be described by referring to FIGS. 2 and 3. When the microcontroller 1 receives a supply voltage Vsupply with a relative high level, the voltage level of the power pin VDD rises, and there is a voltage with a relatively low level at the ground terminal GND. In the embodiment, that the microcontroller 1 is powered on indicates that the microcontroller 1, which did not receive any supply voltage, receives a supply voltage at that time. In an embodiment, when the power line or power input terminal of the electronic device where the microcontroller 1 is disposed receives power from a supply power source, the received power serves as the supply voltage Vsupply or is converted by a power convertor of the electronic device to serve as the supply voltage Vsupply. The supply power source can be a plug seat for main electricity, a power bank, or a device/apparatus which can provide power.

Referring to FIG. 3, due to the RC effect induced by the resistor 13 and the capacitor 14, the voltage level of the reset signal RESB gradually rises from the initial level LVini with the rising voltage level of the power pin VDD during the period P20. Since the locations where the flipflops 201-208 are disposed are close to each other and the lines L21-L28 are arranged symmetrically, as described above, and further since the flipflops 201-208 are not triggered yet, the voltage levels of the positive output terminals Q of the flipflops 201-208 are nearly the same during the period P20, that is, the output values (Q) of the flipflops 201-208 are nearly the same. In other words, the output combination QOUT is "00000000" (the logic "0" represents a relatively low voltage level). The AND gate 210 generates the determination signal S210 with a low voltage level (that is, the determination signal S210 with the logic "0") according to the values (all being the logic "0") at the positive output terminals Q of the flipflops 201, 203, 205, and 207 and the values (all being a logic "1" which represents a relatively high voltage level) at the negative output terminals NQ of the flipflops 202, 204, 206, and 208. In other words, the AND gate 210 determines that the output combination QOUT ("00000000") of the output values Q of the flipflops 201-208 is not the specific value ("10101010") at the present moment. Since the determination signal S210 is at the low voltage level, the level state or logical state of the reset signal OT_RESB is determined according to the reset signal RESB. Thus, during the period P20, the OR gate 211 generates the reset signal OT_RESB with the low voltage level (logic "0") according to the reset signal RESB, which does not reach the threshold level VTH yet. In the embodiment, the threshold level VTH is determined according to the characteristic of the OR gate 211. Once the reset signal RESB reaches the threshold level VTH (at the time point T30), the level state of the reset signal OT_RESB is switched to the high voltage level from the low voltage level (that is, the logical state is switched to the logic "1" from the logic "0").

That the reset signal OT_RESB is switched to the high voltage level from the low voltage level at the time point T30 indicates that a rising edge occurs on the reset signal OT_RESB. The rising edge triggers the flipflops 201-208 through the clock terminal CK of the flipflops 201-208. After the flipflops 201-208 are triggered, the flipflops 201, 203, 205, and 207 whose input terminals D receive the supply voltage Vsupply through the power pin VDD generate the values of the logic "1" at the output terminals D of the flipflops 201, 203, 205, and 207; and the flipflops 202, 204, 206, and 208 whose input terminals D are coupled to the ground terminal GND generate the values of the logic "0" at the output terminals D of the flipflops 202, 204, 206, and 208. Accordingly, the output combination QOUT of the output values (Q) of the flipflops 201-208 is set as "10101010" which is the same as the specific value "10101010". As described above, during the period P20, the output combination QOUT ("00000000") of the output values Q of the flipflops 201-208 is not the specific value ("10101010"). At the time point T30, the output combination QOUT of the output values (Q) of the flipflops 201-208 changes to "10101010". The AND gate 210 generates the determination signal S210 with the high voltage level (that is, the determination signal S210 with the logic "1") according to the values (all being the logic "1") at the positive output terminals Q of the flipflops 201, 203, 205, and 207 and the values (all being a logic "1") at the negative output terminals NQ of the flipflops 202, 204, 206, and 208. In other words, the AND gate 210 determines that the output combination QOUT ("00000000") of the output values Q of the flipflops 201-208 is the specific value ("10101010") at the present moment. Since the determination signal S210 is at the high voltage level, the reset signal OT_RESB is maintained at the high voltage level after the time point T30 through the operation of the OR gate 211, no matter what the voltage level of the reset signal RESB at the reset pin RST changes to.

For example, referring to FIG. 3, during the period when the power pin VDD receives the supply voltage Vsupply continuously, in the cases where the microcontroller 1 is reset through turning on the switch 15 at the time point T31 for a while and then turning off the switch 15 at the time point T32 (that is, the voltage level of the reset signal RESB is switched to the initial level LVini and then gradually rises), the reset signal OT_RESB generated by the OR gate 211 is maintained at the high voltage level and is not affected by the change of the voltage level of the reset signal RESB. Accordingly, after the microcontroller 1 is powered on, the one-time logical circuit 11 performs an initialization operation to set the initial values according to the reset signal OT_RESB only at the time point T30. After the time point T30, even though the microcontroller 1 is reset, the one-time logical circuit 11 does not perform any initialization operation; only after the microcontroller 1 is powered on again (that is, only after the supply voltage Vsupply is not provided to the power pin VDD and then provided to the power pin VDD again), the one-time logical circuit 11 performs the initialization operation again. Thus, in the one-time logical circuit 11, the setting values, which are changed when the microcontroller 11 normally operates, are not set to the initial values after the microcontroller 11 is reset.

For the general logical circuit 12, each time the voltage level of the reset signal RESB gradually rises to a specific voltage level from the initial level LVini, the reset signal RESB is switched to the enabled state from the disabled state. At this time, the general logical circuit 12 performs an initialization operation to set initial values in response to the change of the state of the reset signal RESB. Thus, the general logical circuit 12 performs an initialization operation after the microcontroller 1 is reset and also performs an initialization operation after the microcontroller 1 is reset.

According to the above embodiments, through the operation of the reset circuit 10, it is ensured that the one-time logical circuit 11 and the general logical circuit 12 can perform the respective initialization operations after the microcontroller 1 is powered on, so that the system can operate normally. Moreover, through the reset circuit 10, after the microcontroller 1 is reset, the setting values in the one-time logical circuit 11, which are changed by the microcontroller 11, are not set to the initial values.

In above embodiments, the number of flipflops in the reset circuit 10, the connection between the flipflops 201-208 and the determination logical circuit 21, and the circuit structure of the determination logical circuit 21 are given as an example for illustration. In other embodiments, the determination logical circuit 21 is coupled to the positive output terminals Q of all the flipflops 201-208 so as to determine whether the output combination QOUT of the output values (Q) is the specific value. In this case, there is a different circuit structure for the determination logical circuit 21.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A microcontroller comprising:
    a reset pin, wherein a first reset signal is generated at the reset pin when the microcontroller is powered on;
    a reset circuit receiving the first reset signal, configured to generate a second reset signal, and comprising a plurality of flipflops, wherein after the microcontroller is powered on, the reset circuit switches a state of the second reset signal according to the first reset signal when an output combination of a plurality of output values of the plurality of flipflops is not a specific value; and
    a first logical circuit configured to receive the second reset signal and perform a first initialization operation when the state of the second reset signal is switched,
    wherein when the second reset signal is switched, the reset circuit sets the output combination of the plurality of output values of the plurality of flipflops to the specific value.

2. The microcontroller as claimed in claim 1, wherein the microcontroller is disposed on a chip substrate, and the plurality of flipflops are disposed on locations on the chip substrate which are close to each other.

3. The microcontroller as claimed in claim 1, wherein the reset circuit further comprises:
    a determination logical circuit, coupled to the plurality of flipflops, receiving the first reset signal and determining whether the output combination of the plurality of output values of the plurality of flipflops is the specific value,
    wherein when the determination logical circuit determines that the output combination of the plurality of output values of the plurality of flipflops is not the specific value, the determination logical circuit switches the state of the second reset signal according to the first reset signal.

4. The microcontroller as claimed in claim 3, wherein during a first period which occurs after the microcontroller is powered on, a level of the first reset signal gradually rises, and the output combination of the plurality of output values of the plurality of flipflops is not the specific value.

5. The microcontroller as claimed in claim 3, wherein the determination logical circuit comprises:
    a first logic gate coupled to the plurality of flipflops and configured to generate a determination signal to indicate whether the output combination of the plurality of output values of the plurality of flipflops is the specific value; and
    a second logic gate configured to receive the first reset signal and the determination signal and generating the second reset signal.

6. The microcontroller as claimed in claim 5,
    wherein each of the plurality of flipflops has an input terminal, a clock terminal, a positive output terminal, and negative output terminal, and the input terminal of each of the plurality of flipflops receives the second reset signal,
    wherein the plurality of flipflops comprises at least one first flipflop and at least one second flipflop, the input terminal of the at least one first flipflop receives a supply voltage, and the positive output terminal of the at least one first flipflop is coupled to the first logic gate, and
    wherein the input terminal of the at least one second flipflop is coupled to a ground terminal and the negative output terminal of the at least one first flipflop is coupled to the first logic gate.

7. The microcontroller as claimed in claim 6, wherein the first logic gate is implemented by an AND gate, and the second logic gate is implemented by an OR gate.

8. The microcontroller as claimed in claim 1, wherein after the first logical circuit performs the first initialization operation, the output combination of the plurality of output values of the plurality of flipflops is maintained as the specific value.

9. A microcontroller comprising:
   a reset pin, wherein when a supply voltage is provided to the microcontroller, a level of a first reset signal at the reset pin gradually rises from an initial level;
   a reset circuit coupled to the reset pin and configured to generate a second reset signal, wherein during a period when the level of the first reset signal gradually rises, the reset circuit switches a level of the second reset signal from a first level to a second level at a first time point; and
   a first logical circuit configured to receive the second reset signal and performing a first initialization operation when the level of the second reset signal is switched from the first level to the second level,
   wherein during a period when the supply voltage is provided to the microcontroller continuously, after the first time point, when the level of the first reset signal is switched to the initial level and then gradually rises again, the reset circuit maintains the level of the second reset signal at the second level.

10. The microcontroller as claimed in claim 9, further comprising:
    a second logical circuit configured to receive the first reset signal and perform a second initialization operation each when the level of the first reset signal at the reset pin gradually rises from the initial level.

* * * * *